(12) United States Patent
Gacusan

(10) Patent No.: US 6,696,320 B2
(45) Date of Patent: Feb. 24, 2004

(54) LOW PROFILE STACKED MULTI-CHIP PACKAGE AND METHOD OF FORMING SAME

(75) Inventor: Rodolfo L. Gacusan, Cavite (PH)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/968,365

(22) Filed: Sep. 30, 2001

(65) Prior Publication Data

US 2003/0064545 A1 Apr. 3, 2003

(51) Int. Cl.[7] .................. H01L 21/44; H01L 21/48; H01L 21/50; H01L 23/48; H01L 23/52

(52) U.S. Cl. .................. 438/109; 257/777; 361/736

(58) Field of Search .................. 438/109; 257/777; 361/736

(56) References Cited

U.S. PATENT DOCUMENTS

| | | | | |
|---|---|---|---|---|
| 5,111,278 A | * | 5/1992 | Eichelberger | 357/75 |
| 5,196,376 A | * | 3/1993 | Reche | |
| 5,608,264 A | * | 3/1997 | Gaul | 257/734 |
| 5,870,289 A | | 2/1999 | Tokuda et al. | |
| 6,172,418 B1 | * | 1/2001 | Iwase | 257/723 |
| 6,184,463 B1 | | 2/2001 | Panchou et al. | |
| 6,218,214 B1 | | 4/2001 | Panchou et al. | |
| 6,235,554 B1 | * | 5/2001 | Akram et al. | 438/109 |
| 6,262,895 B1 | | 7/2001 | Forthun | |
| 6,278,616 B1 | | 8/2001 | Gelsomini et al. | |
| 2002/0100751 A1 | * | 8/2002 | Carr | 219/209 |

* cited by examiner

Primary Examiner—Carl Whitehead, Jr.
Assistant Examiner—Nema Berezny
(74) Attorney, Agent, or Firm—Blakely, Sokoloff, Taylor & Zafman LLP

(57) ABSTRACT

A stacked multi-chip package includes first chip with conductive pads on both front and back sides. The front side may include a polymer layer with interconnect. A first polymer layer formed on the backside of the first chip has a cutout to receive a second chip. The first and second chip may be joined as a flip chip. A second polymer layer formed on the first polymer layer has a cutout to receive a third chip. A third polymer layer formed on the second polymer layer contains interconnect to interconnect the first, second and third chips, including the backside of the first chip. Conductive bumps on the front side of the first chip and on the polymer layers provide external I/O connection.

23 Claims, 4 Drawing Sheets

LOW PROFILE STACKED MULTI-CHIP PACKAGE AND METHOD OF FORMING SAME

TECHNICAL FIELD

This disclosure relates generally to integrated circuits, and in particular but not exclusively, relates to integrated circuit packaging.

BACKGROUND

Many integrated circuits (i.e., chips) have a need for a large number of input and/or output (I/O) connections off the chip. However, typical chips use the periphery of the chip to provide I/O connections, which works well with conventional wire bonding technology to implement the off-chip connections. Relatively new flip chip technology can be used to provide an increased number of I/O connections on the circuit side of the chip. Flip chips typically use conductive "bumps" formed on the surface of the circuit side of the flip chip, which are used to make off-chip connections to corresponding conductive regions on an interconnect substrate (e.g., ceramic, flexible tape), or printed wiring board or other interconnect structure.

However, the demand continues for even more I/O connections. At the same time, users typically desire a thin profile or pitch when the chips are packaged, along with short interconnections to facilitate high-speed signal transmission. Current solutions have problems addressing these sometimes conflicting needs.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments of a low-profile stacked multi-chip package and a method of making the package are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
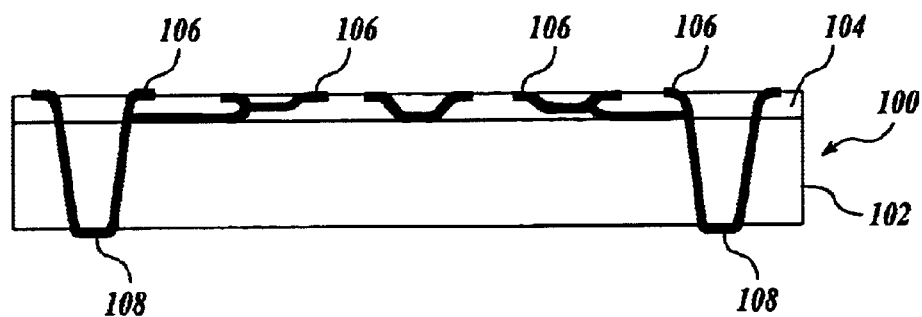
FIGS. 1–10 are schematic sectional views illustrating stages in a process of fabricating a stacked multi-chip package, according to one embodiment of the present invention.

FIG. 1 illustrates a stage in a process of fabricating a stacked multi-chip package, according to one embodiment of the present invention. In particular, FIG. 1 shows a portion 100 of a wafer having a chip formed therein with contacts on both sides of wafer. This embodiment is performed as a wafer level packing (WLP) process, which can advantageously reduce per die fabrication costs in many applications.

In this embodiment, portion 100 includes a semiconductor substrate 102 formed from a material such as, for example, crystalline silicon. In other embodiments, substrate 102 may be formed from other semiconductor material or materials (e.g., Gallium Arsenide). Active circuitry is formed in a "front side" of the wafer. This front side circuitry is generally present in an upper portion of the wafer. In some embodiments, a region 104 is formed on the surface of substrate 102 to provide interconnects and redistribution of via pads. In one this embodiment, region 104 is a polymer material with vias and other conductive interconnect formed on and in the polymer material. In this embodiment, this interconnect is formed using redistribution technology available from Fraunhofer IZM, Berlin, Germany. This redistribution of interconnect and via pads is described further below in conjunction with FIG. 9.

In an alternative embodiment, the upper part of the wafer is indicated in FIG. 1 as a region 104. Region 104 can be deposited on substrate 102 (e.g., an epitaxial silicon layer) or can simply be the portion of the wafer near the front side surface having doped regions formed therein and having various conductive and insulative/dielectric layers formed thereon. In one embodiment, the active circuitry is formed using conventional chip fabrication techniques. As shown in FIG. 1, active circuitry also has via pads 106 formed on the front side of the wafer.

In addition, the wafer has via pads 108 formed on the backside of the wafer that are electrically connected to the portions of the active circuitry formed on the front side of the wafer. In one embodiment, backside via pads 108 are formed using Atmospheric Downstream Plasma (ADP) technology available from Tru-Si Technologies, Sunnyvale Calif. In one embodiment, the resulting thickness of region 104 together with substrate 102 is about 175 $\mu$m, although in other embodiments the thickness may range from about 175 $\mu$m to 200 $\mu$m. In accordance with the present invention, portion 100 serves as the base chip of a stacked multi-chip structure when separated from the wafer.

Figure 2:
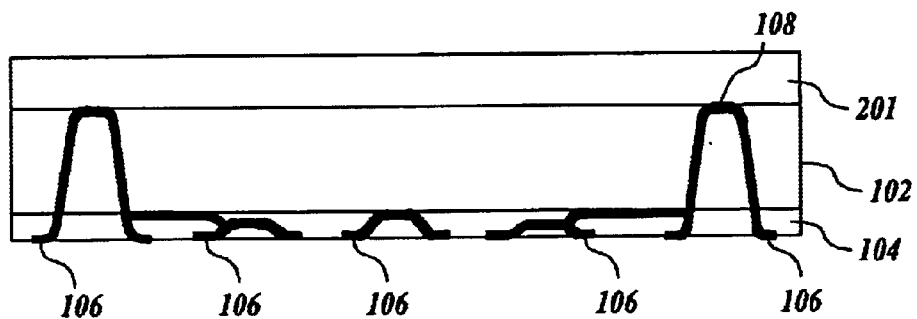

FIG. 2 illustrates another stage in the process of fabricating a stacked multi-chip package, according to one embodiment of the present invention. In particular, FIG. 2 shows the wafer in a "flipped" position (i.e., with the front side down). In this embodiment, a passivation layer 201 formed on the backside of the wafer, covering backside via pads 108. In one embodiment, passivation layer 201 is formed by deposition of a polymer layer. In some embodiments, standard techniques are used to deposit a polymer material to form passivation layer 201. For example, passivation layer 201 may be formed by chemical vapor deposition (CVD), ink jet deposition and sputter of lower (e.g., 2.0 to 2.5 constant) dielectric constant polymer. In this embodiment passivation layer 201 has a thickness of about 100 $\mu$m, although a thickness ranging from about 100 $\mu$m to about 250 $\mu$m can be used in other embodiments. In other embodiments, passivation layer 201 can be made of material other than polymer. The exposed surface of passivation layer 201 is planarized using any suitable planarization technique (e.g., CMP or etch back process). In other embodiments, passivation layer 201 need not be subjected to a separate planarization process.

Figure 3:
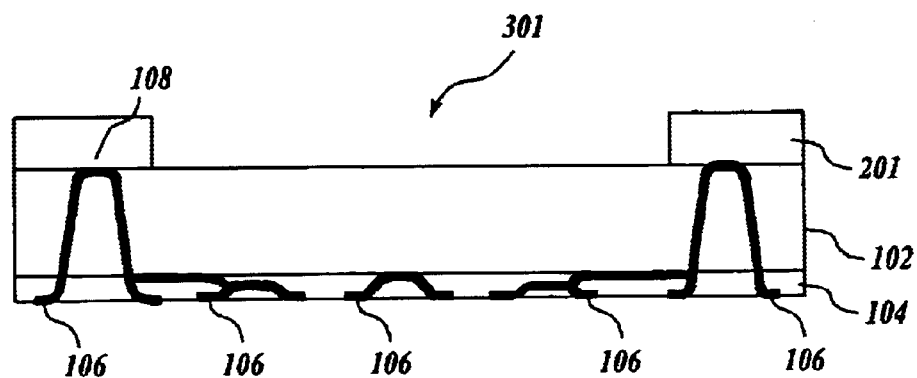

FIG. 3 illustrates another stage in the process of fabricating a stacked multi-chip package, according to one embodiment of the present invention. In this stage, a cutout 301 is formed in passivation layer 201 to expose a portion of the backside of substrate 102. Cutout 301 is aligned with the active circuitry in region 104. In one embodiment, cutout 301 is formed using standard techniques for laser cutting polymer material. In other embodiments, different techniques can be used to form cutout 301 such as, for example, an etching process. As will be described below, cutout 301 is sized to allow a second chip to be placed in contact with the backside of substrate 102 with a desired alignment.

Figure 4:
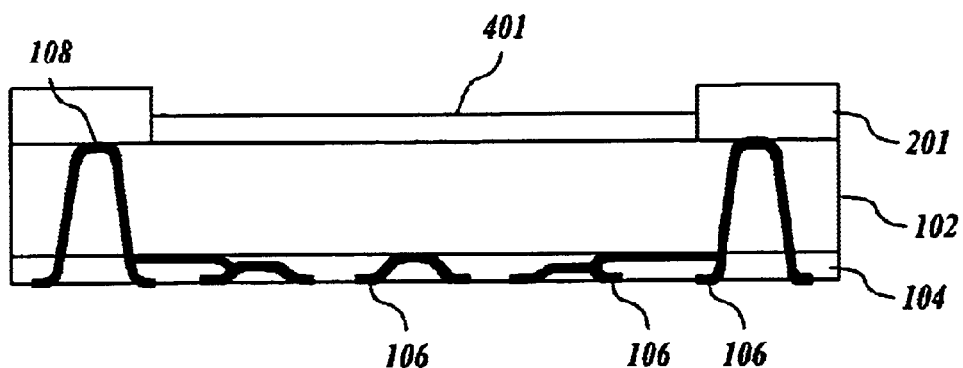

FIG. 4 illustrates another stage in the process of fabricating a stacked multi-chip package, according to one embodiment of the present invention. In this stage, a second chip 401 is placed in cutout 301. In this embodiment, the front side of second chip 401 faces toward substrate 102 and is connected to the base chip using flip-chip (FC) technology. The size and location of cutout 301 is such that second chip 401 fits precisely within cutout 301 so that second chip 401 contacts region 104 with the desired alignment.

In one embodiment, second chip 401 has a thickness of about 75 μm, although the thickness can range from about 75 μm to about 100 μm in other embodiments. In one embodiment, second chip 401 is thinned using the aforementioned ADP technology available from Tru-Si Technologies. This thinning process may also be used to form contacts on the backside of second chip 401. In other embodiments, different chip thinning technologies can be used to achieve the desired thickness of second chip 401. Second chip 401, in one embodiment, is attached to the surface of region 104 using an adhesive such as, for example, anisotropic conductive adhesive (ACA) as in FC joining technology. In other embodiments, second chip 401 have its front side facing away from the base chip, and can be attached to the surface of region 104 using other suitable techniques.

Figure 5:
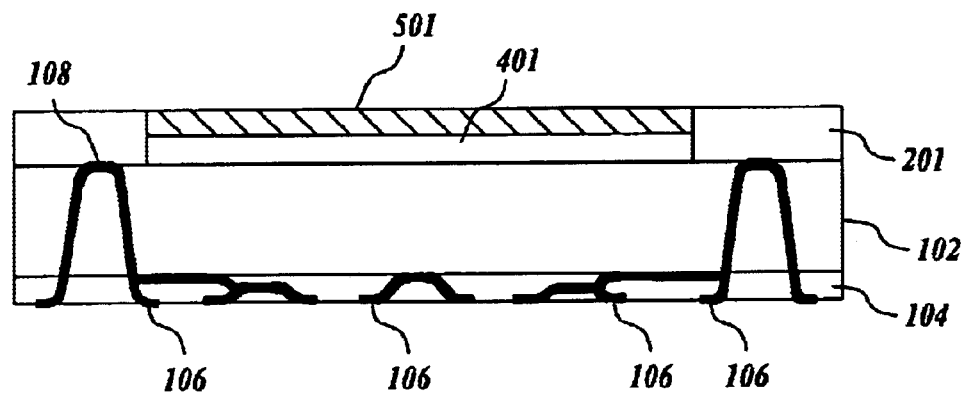

FIG. 5 illustrates another stage in the process of fabricating a stacked multi-chip package, according to one embodiment of the present invention. In this stage, a passivation or dielectric layer 501 (also referred to herein as a passivation/dielectric layer) is formed on the wafer, covering second chip 401. In one embodiment, passivation/dielectric layer 501 is formed of the same polymer material and in the same manner as passivation layer 201 (described above in conjunction with FIG. 2). The exposed surface of passivation/dielectric layer 501 is planarized as described above for passivation layer 201 (FIG. 2). In other embodiments, passivation/dielectric layer 501 need not be subjected to a separate planarization process.

Figure 6:
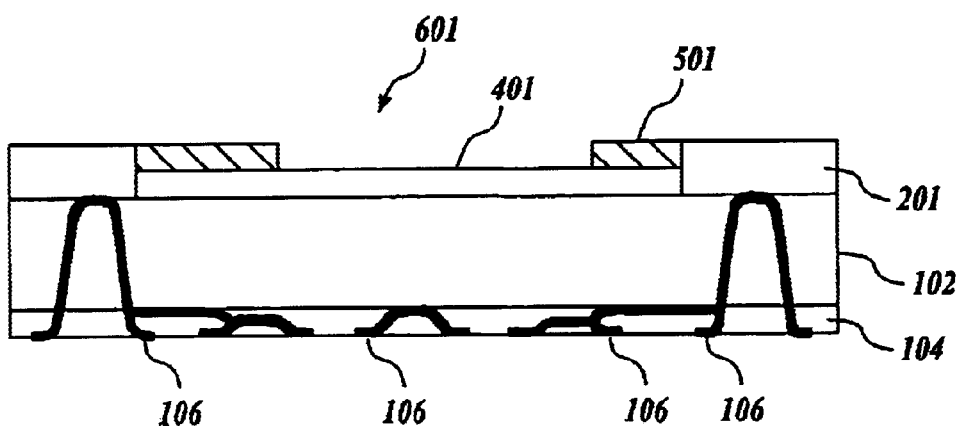

FIG. 6 illustrates another stage in the process of fabricating a stacked multi-chip package, according to one embodiment of the present invention. In this stage, a cutout 601 is formed in passivation/dielectric layer 501 to expose a portion of second chip 401. Cutout 601 is aligned with the active circuitry of second chip 401. In one embodiment, cutout 601 as described above for cutout 301 (FIG. 3). As will be described below, cutout 601 is sized to allow a third chip to be placed in contact with second chip 401 with a desired alignment.

Figure 7:
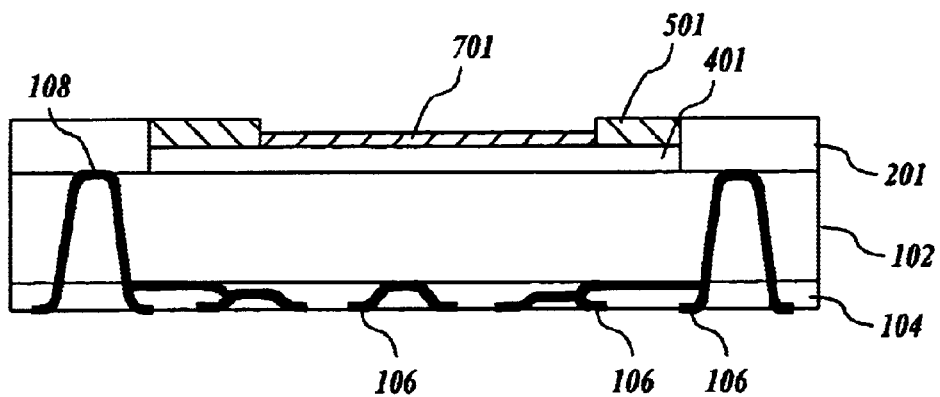

FIG. 7 illustrates another stage in the process of fabricating a stacked multi-chip package, according to one embodiment of the present invention. In this stage, a third chip 701 is fitted into cutout 601, contacting second chip 401. The size and location of cutout 601 is such that third chip 701 fits precisely within cutout 601 so that third chip 701 contacts second chip 401 with proper alignment. In some embodiments, third chip 701 and second chip 401 have front side-to-front side contact. In other embodiments, third chip 701, when placed in cutout 601, may have its front side facing away from second chip 401. In still other embodiments, third chip 701 need not contact second chip 401. For example, the formation of cutout 601 may be stopped before second chip 401 is exposed. Although third chip 701 is shown in FIG. 7 as having a smaller width (i.e., the horizontal dimension in FIG. 7), in other embodiments, third chip 701 may have an equal or larger width than second chip 401.

In one embodiment, third chip 701 has a thickness of about 50 μm, although the thickness can range from about 50 μm to about 75 μm in other embodiments. In one embodiment, third chip 701 is thinned using the aforementioned ADP technology available from Tru-Si Technologies. In other embodiments, different chip thinning technologies can be used to achieve the desired thickness of third chip 701. Third chip 701, in one embodiment, is attached to second chip 401 using an adhesive. In other embodiments, third chip 701 may be attached to second chip 401 using other suitable techniques.

In an alternative embodiment, third chip 701 may be placed on second chip 401 after second chip 401 is placed in cutout 301 (see FIG. 3). In this alternative embodiment, third chip 701 would have the same length and width dimensions as second chip 401 so that third chip 701 would be properly fitted into cutout 301. Then the stages of FIGS. 5 and 6 could be omitted.

Figure 8:
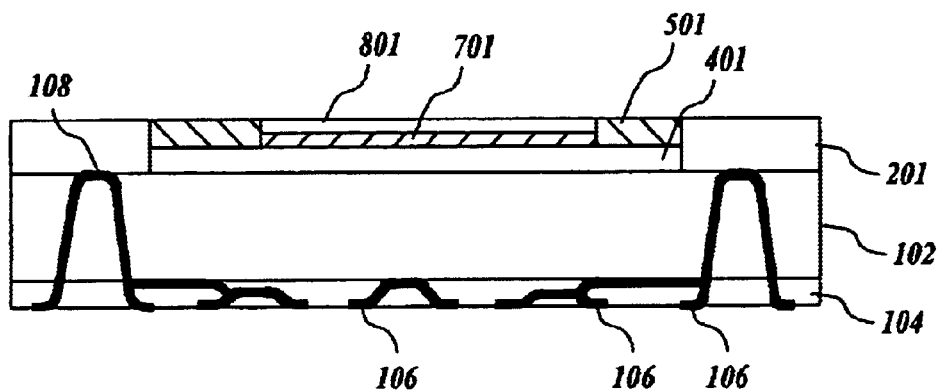

FIG. 8 illustrates another stage in the process of fabricating a stacked multi-chip package, according to one embodiment of the present invention. In this stage, a passivation or dielectric layer 801 is formed on the wafer, covering third chip 701. In one embodiment, passivation/dielectric layer 801 is formed of the same polymer material and in the same manner as passivation layer 201 (described above in conjunction with FIG. 2). The exposed surface of passivation/dielectric layer 801 is planarized as described above for passivation layer 201 (FIG. 2).

Figure 9:
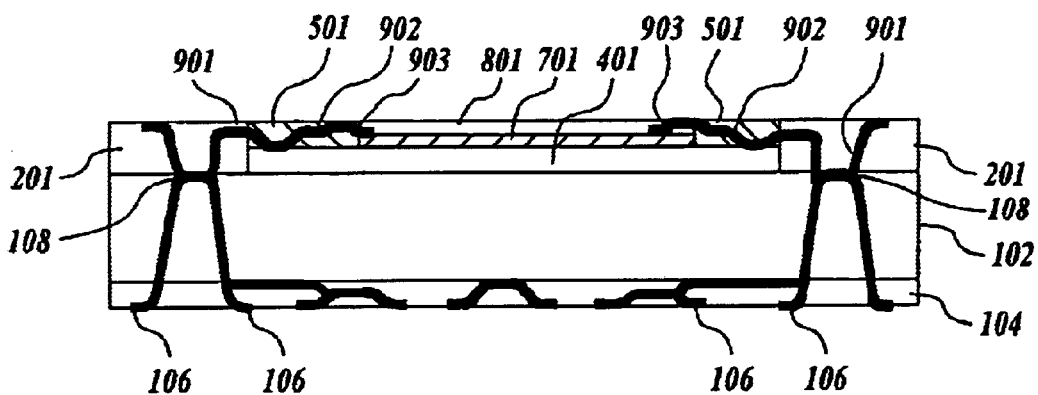

FIG. 9 illustrates another stage in the process of fabricating a stacked multi-chip package, according to one embodiment of the present invention. In this stage, interconnect and via pads are formed in layers 201, 401, 501 and 801. As shown in FIG. 9, interconnect 901 is formed in passivation layer 201 to provide electrical connection to via pads 108 that were previously formed on the backside of substrate 102. In this embodiment, interconnect 901 also provides via pads on the exposed surface of layer 201 to access via pads 108.

Interconnect 902 is formed in passivation/dielectric layer 501 to provide electrical connection to second chip 401. In one embodiment, interconnect 902 can also be electrically connected to interconnect 901 and/or provide via pads on the exposed surface of passivation layer 501. Similarly, interconnect 903 is formed in passivation/dielectric layer 801 to provide electrical connection to third chip 701. Interconnect 903 can also be electrically connected to interconnect 901 and/or 902 and can be used to form via pads on the exposed surface of passivation/dielectric layer 801.

In one embodiment, layers 201, 401, 501 and 801 are all made of polymer material, which allows the aforementioned Fraunhofer IZM technology to be used to concurrently fabricate interconnect 901, 902 and 903 using electroless copper and Ni/Au deposition techniques.

Figure 10:
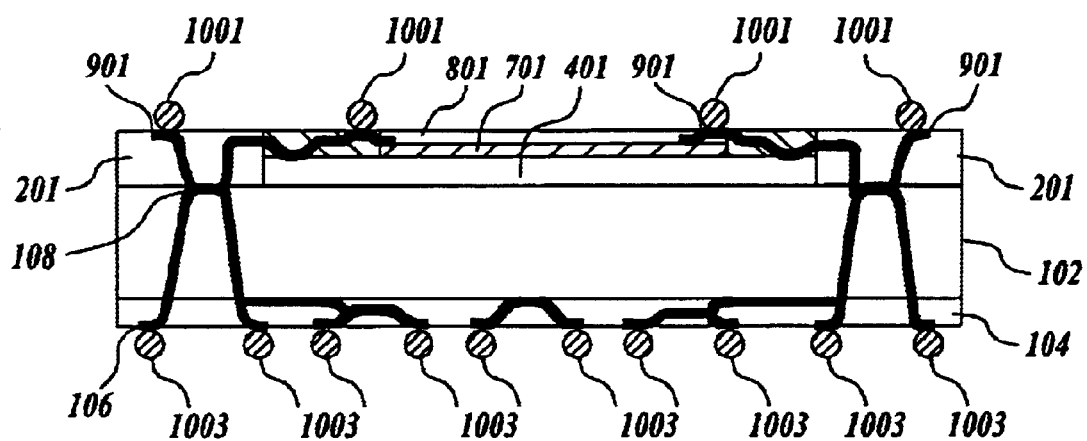

FIG. 10 illustrates another stage in the process of fabricating a stacked multi-chip package, according to one embodiment of the present invention. In this stage, conductive bumps 1001 and 1003 are formed on the stacked multi-chip structure resulting from the stage described above in conjunction with FIG. 9. In this embodiment, bumps 1001 are formed on via pads of interconnect 901–903 formed on the exposed surfaces of layers 201, 401, 501 and 801. In one embodiment, bumps 1001 provide test access points for use when the stacked multi-chip structure is cut from the wafer and packaged. Bumps 1003 are formed on via pads 106 on the exposed surface of region 104. In one embodiment, bumps 1003 are used to electrically connect circuitry of the stacked multi-chip structure to I/O pins of a ball grid array (BGA) package. Of course, bumps 1001 and 1003 can also be used to provide test access points during wafer level testing.

In some embodiments, bumps 1001 and 1003 are formed using electroless Ni or Ni/Au bumping technology or FC joining technologies. Such FC joining technologies include, for example, anisotropic conductive adhesive (ACA) stencil printing or isotropic conductive adhesive (ISA) techniques. The stacked multi-chip structure can then be attached to a wiring board or other interconnect substrate using wire bonding (WB) or FC techniques.

The resulting stacked multi-chip package advantageously achieves a relatively small thickness (i.e., z-profile), a relatively large number of I/O pins, and high functionality (i.e., the functionality of three chips) in a single relatively small package. In addition, because this structure is formed as a WLP, significant fabrication cost savings can be achieved.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method, comprising:
   forming a first chip having a first side and a second side, the first and second sides having a first plurality of conductive pads formed thereon, at least one conductive pad on the first side being electrically connected to a conductive pad on the second side, the first side containing active circuitry of the first chip;
   forming, on the second side of the first chip, a first layer having a first hole to receive a second chip and fitting the second chip in the first hole;
   forming, on the first layer, a second layer having a second hole to receive a third chip and fitting the third chip in the second hole;
   forming, on the second layer, a third layer covering the third chip; and
   forming interconnect in the one or more of the first, second or third layers to electrically connect at least one conductive pad of the first plurality of conductive pads to one or more of the second and third chips.

2. The method of claim 1, wherein forming the interconnect further comprises forming a second plurality of conductive pads on an exposed surface of one or more of the first, second or third layers.

3. The method of claim 1, further comprising forming a polymer layer with second interconnect on the first side of the first chip, the second interconnect electrically connected to conductive pads of the first plurality of conductive pads on the first side of the first chip, the second interconnect further including third conductive pads on an exposed surface of the polymer layer.

4. The method of claim 1, wherein the first, second and third layers comprise a polymer material.

5. The method of claim 1, further comprising:
   forming a first plurality of conductive bumps that are electrically connected to conductive pads on the first side of the first chip; and
   forming a second plurality of conductive bumps on at least one exposed surface of one or more of the first, second or third layers, the first chip being disposed between the first and second plurality of conductive bumps.

6. The method of claim 5, wherein the first plurality of conductive bumps are connected to a ball grid array.

7. The method of claim 6, wherein the second plurality of conductive bumps are used to provide test access points.

8. The method of claim 1, wherein the second chip is joined to the first chip to form a flip-chip structure.

9. The method of claim 1, wherein the interconnect comprises metal formed by electroless deposition.

10. The method of claim 1, wherein the interconnect comprises vias formed using a laser cutting process.

11. The method of claim 1, wherein the first and second cutouts are formed using a laser cutting process.

12. The method of claim 1, wherein the first, second and third chips are thinned using an atmospheric downstream plasma process.

13. The method of claim 1, further comprising singulating the first, second and third chips together in a single package.

14. The method of claim 1, wherein the second chip has a thickness of about 75 $\mu$m.

15. The method of claim 14, wherein the third chip has a thickness of about 50 $\mu$m.

16. A method, comprising:
   forming a first chip having a first side and a second side, the first and second sides having a first plurality of conductive pads formed thereon, at least one conductive pad on the first side being electrically connected to a conductive pad on the second side, the first side containing active circuitry of the first chip;
   forming, on the second side of the first chip, a first layer having a first cutout to receive a second chip and fitting the second chip in the first cutout;
   forming, on the first layer, a second layer having a second cutout to receive a third chip and fitting the third chip in the second cutout;
   forming, on the second layer, a third layer covering the third chip, wherein the first, second, and third layers are each separate layers; and
   forming interconnect in the one or more of the first, second or third layers to electrically connect at least one conductive pad of the first plurality of conductive pads to one or more of the second and third chips.

17. The method of claim 16, wherein forming the interconnect further comprises forming a second plurality of conductive pads on an exposed surface of one or more of the first, second or third layers.

18. The method of claim 16, further comprising forming a polymer layer with second interconnect on the first side of the first chip, the second interconnect electrically connected to conductive pads of the first plurality of conductive pads on the first side of the first chip, the second interconnect further including third conductive pads on an exposed surface of the polymer layer.

19. The method of claim 16, further comprising:

forming a first plurality of conductive bumps that are electrically connected to conductive pads on the first side of the first chip; and forming a second plurality of conductive bumps on at least one exposed surface of one or more of the first, second or third layers, the first chip being disposed between the first and second plurality of conductive bumps.

20. A method, comprising:

forming a first chip having a first side and a second side, the first and second sides having a first plurality of conductive pads formed thereon, at least one conductive pad on the first side being electrically connected to a conductive pad on the second side, the first side containing active circuitry of the first chip;

forming, on the second side of the first chip, a first layer having a first cutout to receive a second chip and fitting the second chip in the first cutout, wherein the first layer is in contact with the second layer;

forming, on the first layer, a second layer having a second cutout to receive a third chip and fitting the third chip in the second cutout, wherein the second layer is in contact with the third layer;

forming, on the second layer, a third layer covering the third chip; and forming interconnect in the one or more of the first, second or third layers to electrically connect at least one conductive pad of the first plurality of conductive pads to one or more of the second and third chips;

wherein the first, second, and third layers are separate, discontinuous layers.

21. The method of claim 20, wherein forming the interconnect further comprises forming a second plurality of conductive pads on an exposed surface of one or more of the first, second or third layers.

22. The method of claim 20, further comprising forming a polymer layer with second interconnect on the first side of the first chip, the second interconnect electrically connected to conductive pads of the first plurality of conductive pads on the first side of the first chip, the second interconnect further including third conductive pads on an exposed surface of the polymer layer.

23. The method of claim 20, further comprising:

forming a first plurality of conductive bumps that are electrically connected to conductive pads on the first side of the first chip; and forming a second plurality of conductive bumps on at least one exposed surface of one or more of the first, second or third layers, the first chip being disposed between the first and second plurality of conductive bumps.

* * * * *